(12) United States Patent
Kong et al.

(10) Patent No.: US 10,847,368 B2
(45) Date of Patent: Nov. 24, 2020

(54) EUV RESIST PATTERNING USING PULSED PLASMA

(71) Applicant: Applied Materials, Inc., Santa Clara, CA (US)

(72) Inventors: Byungkook Kong, San Ramon, CA (US); Sangwook Kim, Palo Alto, CA (US); SeungHyun Park, San Jose, CA (US); Abhjeet Bagal, Sunnyvale, CA (US); Kyoungjin Lee, Belmont, CA (US); Daksh Agarwal, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/481,885

(22) Filed: Apr. 7, 2017

(65) Prior Publication Data

US 2018/0292756 A1 Oct. 11, 2018

(51) Int. Cl.
*H01J 37/32* (2006.01)
*H01L 21/033* (2006.01)
*H01L 21/311* (2006.01)

(52) U.S. Cl.
CPC .......... *H01L 21/0337* (2013.01); *H01J 37/32* (2013.01); *H01J 37/321* (2013.01); *H01J 37/32146* (2013.01); *H01J 37/32706* (2013.01); *H01L 21/31122* (2013.01); *H01L 21/31144* (2013.01)

(58) Field of Classification Search
CPC .......... H03H 3/00; H03H 7/32; H05K 1/0233; H05K 1/182; H05K 3/202; H05K 3/4092; Y10T 29/49002; Y10T 29/4913; Y10T 29/49158; G03F 7/70033; G03F 7/70041; H01J 37/32; H01J 37/321; H01J 37/32146; H01J 37/32706; H01L 21/0337; H01L 21/31122; H01L 21/31144
USPC .............. 438/706, 710, 712, 714, 723, 736; 156/345.44, 345.47, 345.48
See application file for complete search history.

(56) References Cited

U.S. PATENT DOCUMENTS

| | | | |
|---|---|---|---|
| 2004/0173570 A1* | 9/2004 | Ying | B82Y 10/00 216/63 |
| 2005/0164478 A1* | 7/2005 | Chan | H01L 21/0271 438/585 |
| 2008/0110859 A1* | 5/2008 | Koshiishi | H01J 37/32 216/67 |
| 2011/0143537 A1* | 6/2011 | Lee | H01J 37/32082 438/669 |
| 2012/0152895 A1* | 6/2012 | Chebi | B81C 1/00619 216/37 |
| 2015/0072530 A1* | 3/2015 | Kim | H01L 21/3065 438/703 |
| 2015/0228495 A1 | 8/2015 | Joubert et al. | |
| 2015/0255305 A1* | 9/2015 | Nakagawa | H01J 37/32027 438/714 |

(Continued)

*Primary Examiner* — Lan Vinh

(74) *Attorney, Agent, or Firm* — Schwabe, Williamson & Wyatt, P.C.

(57) ABSTRACT

A coating layer is deposited on a patterned feature on a first portion of a substrate. A second portion of the substrate outside the patterned feature is etched. The etching and the depositing are performed in a single pulsed plasma process using at least one of a pulsed source power signal and a pulsed bias power signal.

18 Claims, 8 Drawing Sheets

(56) References Cited

U.S. PATENT DOCUMENTS

| | | | |
|---|---|---|---|
| 2016/0005602 A1* | 1/2016 | Yoo | H01L 21/0338 |
| | | | 216/41 |
| 2016/0343580 A1* | 11/2016 | Hudson | H01J 37/32513 |
| 2016/0379824 A1* | 12/2016 | Wise | H01L 21/30655 |
| | | | 438/695 |

* cited by examiner

EUV RESIST PATTERNING USING PULSED PLASMA

FIELD

Embodiments of the present invention pertain to the field of electronic device manufacturing, and in particular, to EUV resist patterning.

BACKGROUND

As geometries of the electronic devices shrink, lithography and patterning for electronic device designs become more challenging. A single lithographic exposure may not be enough to provide sufficient resolution. Typically, for manufacturing integrated circuits (ICs) multiple patterning techniques and additional metal layers are used to increase the feature density. The multiple-patterning techniques and implementation of the additional metal layers complicate the manufacturing technology and are expensive.

Generally, an extreme ultraviolet (EUV) lithography that uses the EUV wavelength that is much shorter than the wavelengths of the conventional techniques may be used to scale down the feature sizes on the IC chips. Typically, the EUV lithography uses the EUV resist patterned using a EUV wavelength that is about 13.5 nm. The EUV resist, however, is much less resistant to etching than the photoresist used for conventional patterning techniques. Currently, the integrity of the EUV resist pattern resulted from etching is very poor comparing to that of the conventional photoresists.

Typically, after etching the EUV resist pattern is non-uniform. The non-uniform EUV resist pattern causes difficulties in transferring the pattern to underlying layers, controlling critical dimension (CD) and critical dimension uniformity (CDU) of the patterned features and other IC manufacturing limitations.

SUMMARY

Methods and apparatuses to provide EUV resist patterning using pulsed plasma are described. In one embodiment, a coating layer is deposited on a patterned feature on a first portion of a substrate. A second portion of the substrate that is outside of the patterned feature is etched. The etching and the depositing are performed in a single pulsed plasma process using at least one of a pulsed source power signal and a pulsed bias power signal.

In one embodiment, a pulsed source radio frequency (RF) power signal is generated. A pulsed bias RF power signal is generated. The pulsed bias RF power signal is shifted relative to the pulsed source RF power signal. A coating layer is deposited on a patterned EUV photoresist feature on a first portion of a substrate. A second portion of the substrate outside the patterned feature is etched. The deposition and etching of the coating layer is performed using at least one of the pulsed source RF power signal and the pulsed bias RF power signal.

In one embodiment, a system to manufacture an electronic device comprises a processing chamber that comprises a pedestal to hold a workpiece. The workpiece comprises a patterned feature on a first portion of a substrate. A plasma source is coupled to the processing chamber to generate a pulsed plasma. A source power supply is coupled to the plasma source to generate a pulsed source power signal. A bias power supply is coupled to the pedestal to generate a pulsed bias power signal. A processor is coupled to the processing chamber. The processor has a first configuration to control depositing a coating layer on the patterned feature. The processor has a second configuration to control etching of a second portion of the substrate that is outside the patterned feature. The deposition and etching are performed in a single pulsed plasma process using at least one of the pulsed source power signal and the pulsed bias power signal.

Other features of the present invention will be apparent from the accompanying drawings and from the detailed description which follows.

BRIEF DESCRIPTION OF THE DRAWINGS

The embodiments as described herein are illustrated by way of example and not limitation in the figures of the accompanying drawings in which like references indicate similar elements.

DETAILED DESCRIPTION

Figure 1:
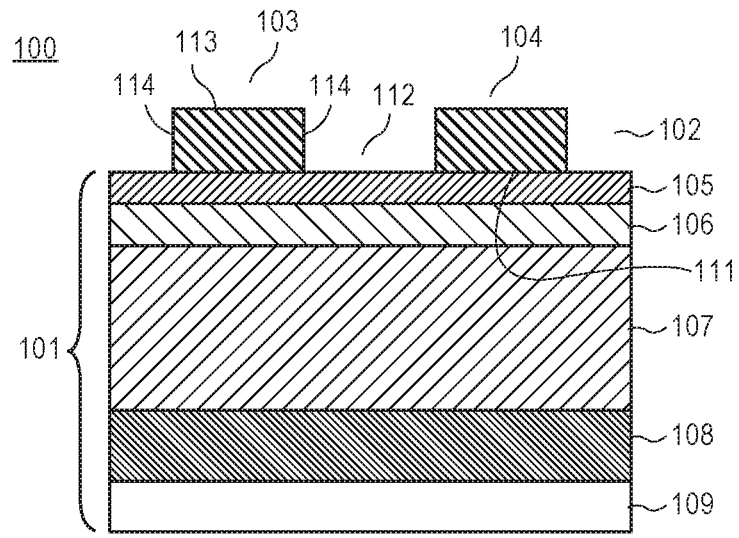
FIG. 1 is a side view of a workpiece to manufacture an electronic device according to one embodiment of the invention.

Methods and apparatuses to provide a pulsed plasma deposition and etching with radio frequency (RF) phase shift for EUV resist patterning for electronic device manufacturing are described. In one embodiment, a coating layer is deposited on a patterned feature on a portion of a substrate. A portion of the substrate that is outside of the patterned feature is etched. The etching and the depositing are performed in a single pulsed plasma process using at least one of a pulsed source RF power signal and a pulsed bias RF power signal. In one embodiment, the etching and the depositing are performed in a single pulsed plasma process by shifting in time, in phase, or both in time and in phase the pulsed bias RF power signal relative to the pulsed source RF power signal.

In the following description, numerous specific details, such as specific materials, chemistries, dimensions of the elements, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment of the invention. Furthermore, the particular features, structures, or characteristics may be combined in any suitable manner in one or more embodiments.

Moreover, inventive aspects lie in less than all the features of a single disclosed embodiment of the invention. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

In one embodiment, the EUV resist patterning is performed using a pulsed plasma etching with phase variation to increase uniformity of the EUV resist pattern. In an embodiment, the EUV resist patterning is performed using a single pulsed plasma process that involves controlling timing between the pulsed source RF power signal and the pulsed bias RF power signal, as described in further detail below.

Traditionally, deposition of the coating layer on the photoresist is performed at one set of the processing chamber conditions e.g., a pressure, a plasma source power, a bias power, a gas flow, a gas chemistry and a temperature. Traditionally, etching of the coating layer is performed at another set of the processing chamber conditions e.g., a pressure, a plasma source power, a bias power, a gas flow, a gas chemistry and a temperature. Conventional techniques to reinforce the EUV photoresist pattern use multiple cycles of the deposition of the coating layer followed by etching of the coating layer. For every cycle, the deposition and etch require different sets of the processing chamber conditions. This is time consuming and adds to the manufacturing complexity.

Embodiments of the EUV resist patterning using a single pulsed plasma process provide an advantage of using the same set of processing chamber conditions for the deposition and etch that reduces the manufacturing time, simplifies the manufacturing process and reduces the manufacturing cost.

A single pulsed plasma process for the EUV photoresist patterning advantageously increases the EUV photoresist selectivity, the integrity and uniformity of the EUV resist pattern comparing to the conventional EUV photoresist patterning techniques, as described in further detail below.

A single pulsed plasma process for the EUV photoresist patterning provides the patterned features having the sizes smaller than 7 nm without using conventional complex multiple-patterning techniques and implementing additional metal layers that simplifies the manufacturing technology and decreases the manufacturing cost. In one embodiment, an appropriate chemistry and advanced RF pulsing feature (phase shift) are used to provide a EUV photoresist pattern having substantially high etch resistance relative to the underlying substrate.

FIG. 1 is a side view 100 of a workpiece to manufacture an electronic device according to one embodiment of the invention. The workpiece comprises a patterned photoresist layer 102 on a substrate 101. As shown in FIG. 1, the patterned photoresist layer 102 includes a plurality of features, such as a feature 103 and a feature 104. As shown in FIG. 1, feature 104 is deposited on a portion 111 of the substrate. Features 104 and 103 are separated by a space that exposes a portion 112 of the substrate 101. Portion 112 of the substrate 101 is outside of the features 103 and 104. As shown in FIG. 1, feature 103 has opposing sidewalls 114 and a top 113. Top 113 is between the opposing sidewalls 114.

In one embodiment, the patterned photoresist layer 102 is a EUV photoresist layer, e.g., a polymer. In one embodiment, the thickness of the patterned photoresist layer 102 is in an approximate range from about 1 nanometers (nm) to about 40 nm. In more specific embodiment, thickness of the patterned photoresist layer 102 is in an approximate range from about 10 nm to about 20 nm.

In an embodiment, the distance between the features 103 and 104 is determined by design. In an embodiment, the width of each of the features 103 and 104 is determined by design. In one embodiment, the width of each of the features 103 and 104 is in an approximate range from about 1 nm to about 20 nm. In one embodiment, the height of each of the features 103 and 104 is determined by the thickness of the photoresist layer 102. In one embodiment, the height of each of the features 103 and 104 is in an approximate range from about 1 nm to about 40 nm.

In one embodiment, the EUV photoresist layer is patterned and etched to form the plurality of features, such as feature 103 and 104. In one embodiment, the EUV photoresist layer is deposited on substrate 101 using one or more of the EUV photoresist deposition techniques (e.g., a spin coating) known to one of ordinary skill in the art of electronic device manufacturing. In one embodiment, the EUV photoresist layer is patterned and etched using any of the EUV photoresist patterning and etching techniques known to one of ordinary skill in the art of electronic device manufacturing.

As shown in FIG. 1, substrate 101 includes a stack of layers, e.g., a layer 105 on a layer 106 on a layer 107 on a layer 108 on layer 109. In one embodiment, layer 109 is an insulating layer. In one embodiment, the insulating layer is an oxide layer, e.g., silicon oxide, aluminum oxide ("Al2O3"), silicon oxide nitride ("SiON"), a silicon nitride layer, an interlayer dielectric (ILD), e.g., silicon dioxide, any combination thereof, or other electrically insulating layer determined by an electronic device design. In another embodiment, the insulating layer includes polyimide, epoxy, photodefinable materials, such as benzocyclobutene (BCB), and WPR-series materials, or spin-on-glass. In an embodiment, the thickness of the insulating layer is from about 2 nanometers ("nm") to about 500 nm, or any other thickness.

The insulating layer can be deposited on an underlying substrate (not shown) using one of a deposition techniques, such as but not limited to a chemical vapour deposition ("CVD"), e.g., a Plasma Enhanced Chemical Vapour Deposition ("PECVD"), a physical vapour deposition ("PVD"), molecular beam epitaxy ("MBE"), metalorganic chemical vapor deposition ("MOCVD"), atomic layer deposition ("ALD"), or other insulating layer deposition techniques known to one of ordinary skill in the art of electronic device manufacturing.

In one embodiment, layer 108 is a conductive layer. In an embodiment, the conductive layer comprises a metal, for example, copper (Cu), aluminum (Al), indium (In), tin (Sn), lead (Pb), silver (Ag), antimony (Sb), bismuth (Bi), zinc (Zn), cadmium (Cd), gold (Au), ruthenium (Ru), nickel (Ni), cobalt (Co), chromium (Cr), iron (Fe), manganese (Mn), titanium (Ti), hafnium (Hf), tantalum (Ta), tungsten (W), vanadium (V), molybdenum (Mo), palladium (Pd), gold (Au), platinum (Pt), polysilicon, other conductive material known to one of ordinary skill in the art of electronic device manufacturing, or any combination thereof. In an embodiment, the thickness of the conductive layer is from about 2 nanometers ("nm") to about 500 nm, or any other thickness. The conductive layer can be deposited using one of the deposition techniques, such as but not limited to CVD, e.g., a PECVD, a PVD, an MBE, an MOCVD, an ALD, or other conductive layer deposition techniques known to one of ordinary skill in the art of electronic device manufacturing.

In one embodiment, the layer 107 is an amorphous carbon layer. In an embodiment, the thickness of the amorphous carbon layer is from about 50 nm to about 200 nm. In an embodiment, the amorphous carbon layer is deposited using a CVD, e.g., a PECVD, a PVD, an MBE, an MOCVD, an ALD, or other amorphous carbon layer deposition techniques known to one of ordinary skill in the art of electronic device manufacturing.

In one embodiment, the layer 106 is a hard mask layer, for example, a silicon carbide, silicon nitride, silicon oxide nitride, aluminum nitride, amorphous silicon, silicon oxide, or other material layer that is etch selective to the underlying layer 107. In an embodiment, the thickness of the hard mask layer is from about 1 nm to about 40 nm. In more specific embodiment, thickness of the hard mask layer is in an approximate range from about 10 nm to about 20 nm. In an embodiment, the hard mask layer is deposited using a CVD, e.g., a PECVD, a PVD, an MBE, an MOCVD, an ALD, or other hard mask layer deposition techniques known to one of ordinary skill in the art of electronic device manufacturing.

In one embodiment, the layer 105 is an anti-reflective coating layer. In more specific embodiment, the layer 105 is a boron doped anti-reflective coating (BARC) layer, e.g., the BARC layer manufactured by Applied Materials, Inc. located in Santa Clara, Calif., or other BARC layer. In an embodiment, the thickness of the anti-reflective coating layer is from about 1 nm to about 10 nm. In an embodiment, the anti-reflective coating layer is deposited using one of the antireflection coating deposition techniques known to one of ordinary skill in the art of electronic device manufacturing. In other embodiments, the layers 105, 106, 107, 108 and 109 represent other material layers.

In one embodiment, substrate 101 includes a semiconductor material, e.g., silicon ("Si"), germanium ("Ge"), silicon germanium ("SiGe"), a III-V materials based material e.g., gallium arsenide ("GaAs"), any combination thereof, or other semiconductor material. In one embodiment, substrate 101 includes metallization interconnect layers for integrated circuits. In one embodiment, substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, substrate 101 includes interconnects, for example, vias, configured to connect the metallization layers.

In one embodiment, substrate 101 is a semiconductor-on-isolator (SOI) substrate including a bulk lower substrate, a middle insulation layer, and a top monocrystalline layer. The top monocrystalline layer may comprise any material listed above, e.g., silicon.

Typically, the features formed using the existing EUV photoresist patterning and etching techniques may have a shoulder recess (faceting), a tapered bottom (footing), and width non-uniformity such that the EUV photoresist pattern is not good enough for forming the features in the underlying layers. In one embodiment, due to the EUV photoresist overexposure, the top 113 may have a recess (faceting) (not shown), the sidewalls 114 may have a tapered bottom (footing) (not shown), and the width of the features 103 and 104 may be not uniform.

Figure 2:
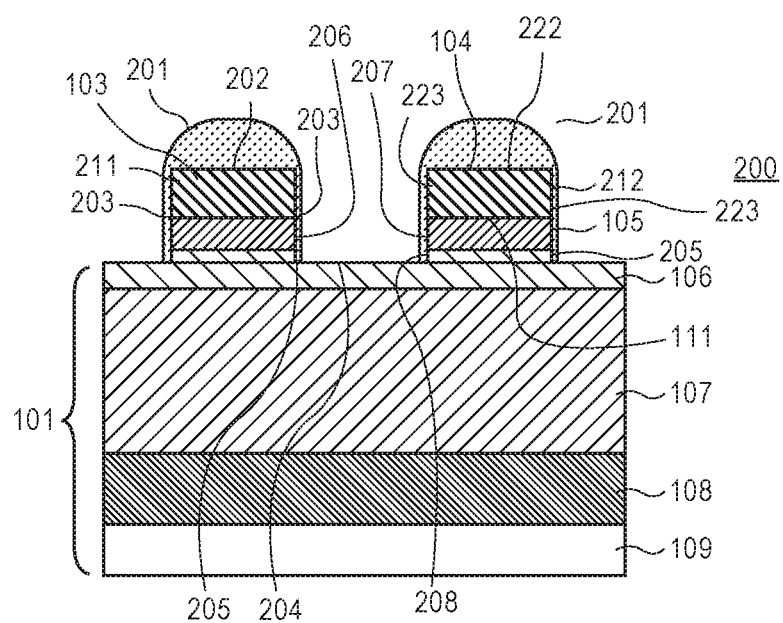
FIG. 2 is a view similar to FIG. 1 after a coating layer is deposited on the features of the patterned photoresist layer according to one embodiment of the invention.

FIG. 2 is a view 200 similar to FIG. 1 after a coating layer 201 is deposited on the features 103 and 104 of the patterned photoresist layer 102 according to one embodiment of the invention. As shown in FIGS. 1 and 2, coating layer 201 is deposited on the features 103 and 104 of patterned photoresist layer 102. Portion 112 between the features 103 and 104 is etched, so that coating layer 201 is not deposited on portion 112. The coating layer 201 is deposited and portion 112 is etched to reinforce the EUV photoresist pattern. In one embodiment, depositing of the coating layer 201 and etching the portion 112 is performed in a single pulsed plasma process using at least one of a pulsed source power signal and a pulsed bias power signal, as described in further detail below. In one embodiment, the coating layer 201 is deposited to protect the patterned EUV photoresist layer (mask) during etching of the underlying substrate layers. In one embodiment, the coating layer 201 is a dielectric layer. In one embodiment, the coating layer 201 is an oxide layer, e.g., silicon oxide, silicon boron oxide-compound, or other oxide layer. In one embodiment, the coating layer 201 is a carbon based polymer layer. In one embodiment, the coating layer 201 is a polymer layer comprising carbon and hydrogen. In one embodiment, the coating layer 201 is deposited to compensate for the footing, faceting and the width uniformity of the features of the patterned photoresist layer 102.

As shown in FIG. 2, the coating layer 201 is not deposited on the portions of the substrate 101 that are not covered by the photoresist features, such as portion 112. The portions of the substrate 101 that are not covered by the photoresist features 103 and 104 are etched to form a feature 211 and a feature 212, as shown in FIG. 2.

As shown in FIG. 2, the portion 112 of the substrate 101 including a portion of the layer 105 and a portion of the layer 106 are etched to form an opening that exposes a portion 204 of the layer 106. As shown in FIG. 2, feature 211 is a stack including feature 103 on a portion 206 of the layer 105 on a portion 205 of the layer 106. Feature 212 is a stack including feature 104 on a portion 207 of the layer 105 on a portion 208 of the layer 106. Feature 211 has a top portion 202 and opposing sidewalls 203. Feature 212 has a top portion 222 and opposing sidewalls 223. The coating layer 201 is deposited on the top portion and opposing sidewalls of each of the features 211 and 212, as shown in FIG. 2. The portions of the substrate 101 that are covered by the photoresist features 103 and 104, such as portion 111 remain substantially intact by the etching.

Figure 5:
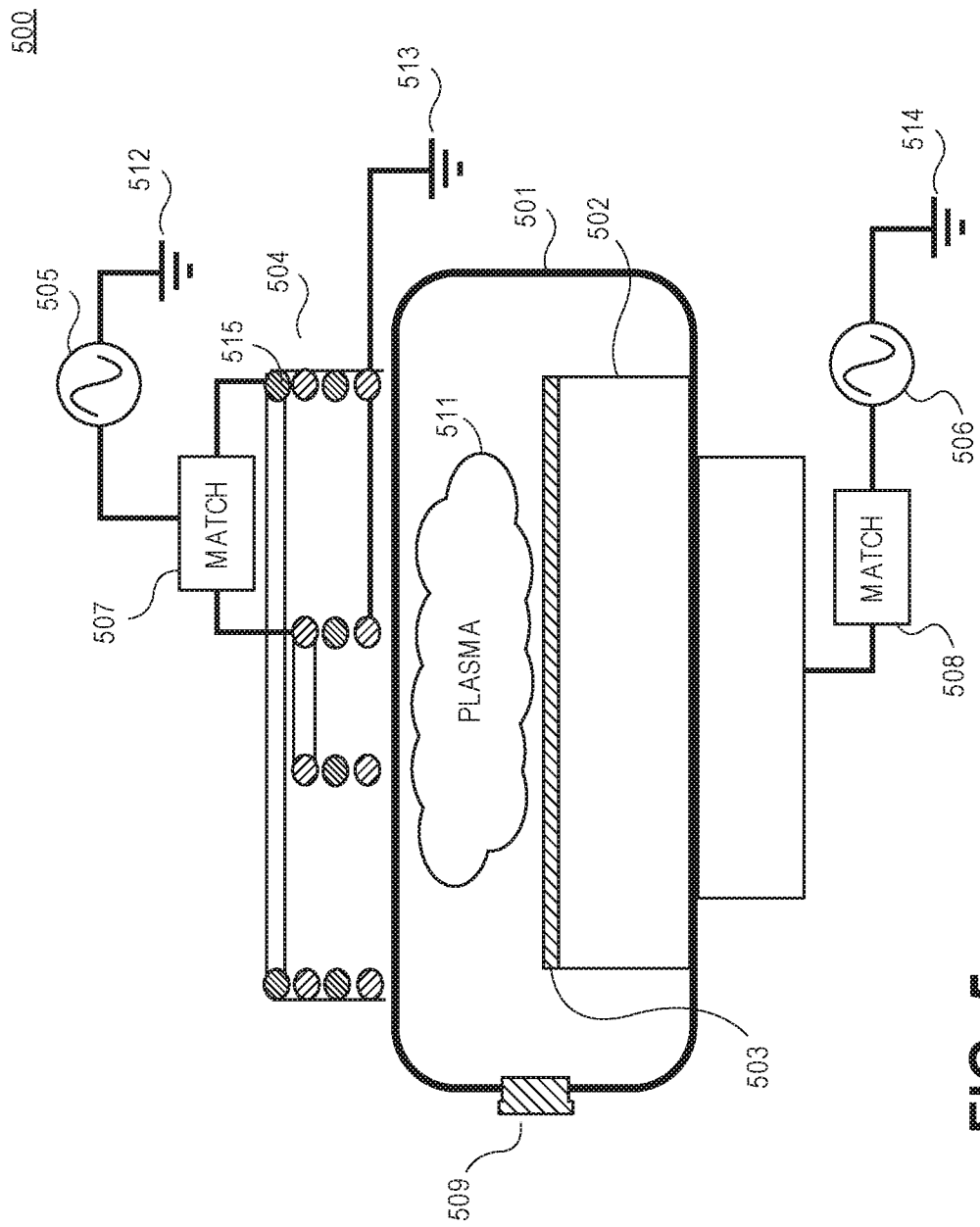
FIG. 5 shows a block diagram of a plasma system to provide an EUV photoresist patterning in a single pulsed plasma process according to one embodiment of the invention.

FIG. 5 shows a block diagram of a plasma system 500 to provide an EUV photoresist patterning in a single pulsed plasma process according to one embodiment of the invention. As shown in FIG. 5, the system 500 has a processing chamber 501. A movable pedestal 502 to hold a workpiece 503 is placed in processing chamber 501. Pedestal 502 comprises an electrostatic chuck ("ESC"), a DC electrode embedded into the ESC, and a cooling/heating base. In an embodiment, the ESC comprises an $Al_2O_3$ material. $Y_2O_3$, or other ceramic materials known to one of ordinary skill of electronic device manufacturing. In one embodiment, a DC power supply (not shown) is connected to the DC electrode of the pedestal 502.

As shown in FIG. 5, a workpiece 1003 is loaded through an opening 509 and placed on the pedestal 502. The workpiece 503 represents one of the workpieces described above with respect to FIG. 1. A plasma source 504 is coupled to the processing chamber 501 to generate a pulsed plasma 511. A source RF power supply 505 is coupled via a RF match 507 to the plasma source 504 to generate a source RF power. Plasma source 504 comprises a coil 515 coupled between the match 507 and a ground 513, as shown in FIG. 5. In one embodiment, plasma 511 in processing chamber 501 is generated from one or more process gases using a high frequency electric field. Plasma 511 comprises plasma particles, such as ions, electrons, radicals, or any combination thereof. In an embodiment, source RF power supply 505 provides the source RF power from about 100 W to about 3000 W at a RF frequency from about 13.56 MHz to about 162 MHz to generate plasma 511. In more specific embodiment, the frequency of the source RF power is about 13.56 MHz. In one embodiment, the source RF power supply 505 is coupled to a switch (not shown) that turns the source RF power ON and OFF at a pulse switching frequency in an approximate range from about 10 Hz to about 10 kHz, and in more specific embodiment, at a pulse switching frequency in an approximate range from about 0.5 kHz to about 10 kHz to provide a pulsed RF source power to plasma source 504 to generate pulsed plasma 511.

A bias RF power supply 506 is coupled to the pedestal 502 via a RF match 508 to energize the plasma 511. As shown in FIG. 5, the bias RF power supply 506 is coupled to a ground 514. In an embodiment, the plasma bias power supply 506 supplies a bias RF power that is not greater than 1000 W at a frequency from about 2 MHz to about 60 MHz, and in a particular embodiment at a frequency of about 13.56 MHz. In one embodiment, the bias RF power supply 506 is coupled to a switch (not shown) that turns the bias RF power ON and OFF at a switching frequency in an approximate range from about 10 Hz to about 10 kHz, and in more specific embodiment, at a pulse switching frequency in an approximate range from about 10 Hz to about 10 kHz to provide a pulsed RF bias power to generate pulsed plasma 511.

In one embodiment, the plasma system 500 is an inductively coupled plasma (ICP) system. The plasma system 500 may be any type of high performance plasma processing systems known in the art to manufacture electronic devices. In an embodiment, the system 500 may represent one of the plasma processing systems manufactured by Applied Materials, Inc. located in Santa Clara, Calif., or any other plasma system.

Figure 6:
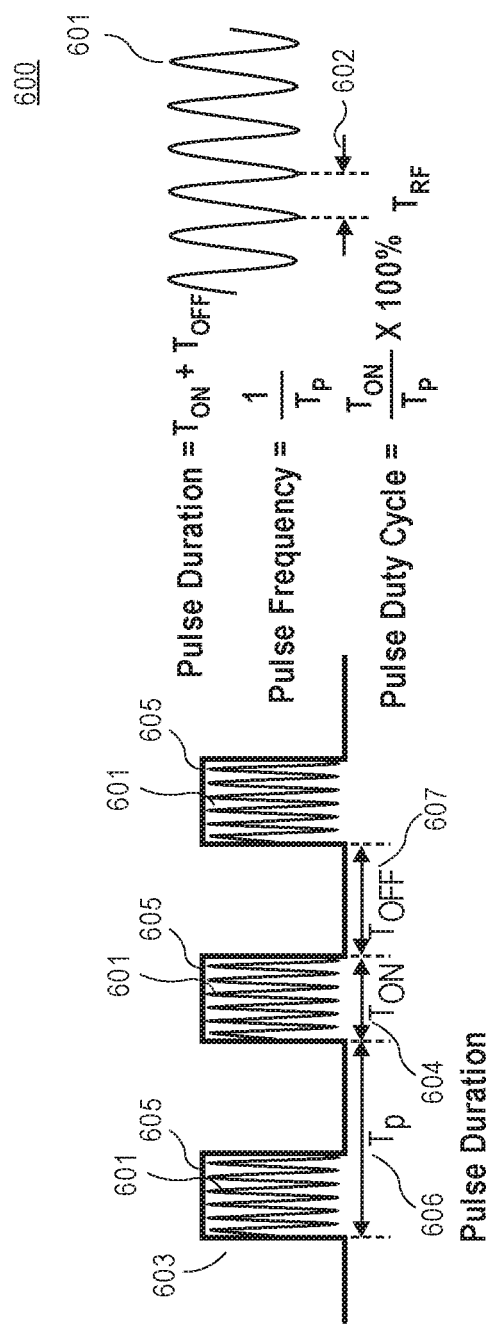
FIG. 6 is a view illustrating a RF power signal and a pulsed RF power signal to provide a single pulsed plasma process according to one embodiment of the invention.

FIG. 6 is a view 600 illustrating a RF power signal 601 and a pulsed RF power signal 603 to provide a single pulsed plasma process according to one embodiment. In one embodiment, the RF power signal 601 represents the source RF power signal. In one embodiment, the RF power signal 601 represents the bias RF power signal. In one embodiment, the RF power signal 601 represents each of the bias RF power signal and the source RF power signal. The RF power signal 601 has a period $T_{rf}$ 602 that is inversely proportional the RF frequency $f_{rf}$ of the RF power signal. As shown in FIG. 6, the RF power signal 601 is turned ON and OFF to generate a pulsed signal 603 comprising a plurality of pulses 605. As shown in FIG. 6, pulsed signal 603 is an envelope of the pulsed RF power signal 601. As shown in FIG. 6, the RF power signal 601 oscillates at the RF frequency $f_{rf}$ within each of the pulses 605. As shown in FIG. 6, a pulse duration Tp 606 of the pulsed RF power signal 603 is a sum of the time when the RF power signal 601 is ON (Ton 604) and the time when the RF power signal 601 is OFF (Toff 607). As shown in FIG. 6, the pulse frequency fp is inversely proportional to the pulse duration Tp. As shown in FIG. 6, the pulse duty cycle is proportional to a ratio of the Ton to the Tp as follows:

$$\text{Pulse Duty Cycle} = \text{Ton}/Tp \times 100\% \qquad (1).$$

Figure 7:
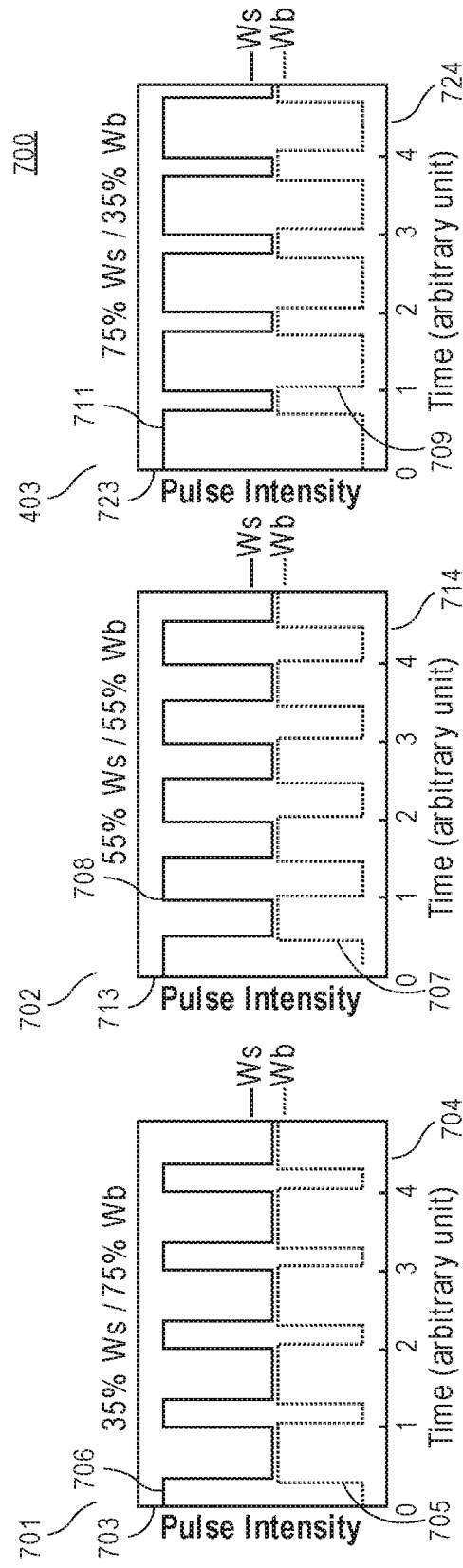
FIG. 7 is a view showing pulse diagrams illustrating the pulsed source power signal and the pulsed bias power signal to provide a single pulsed plasma process according to one embodiment of the invention.

FIG. 7 is a view 700 showing pulse diagrams illustrating the pulsed source power signal and the pulsed bias power signal to provide a single pulsed plasma process according to one embodiment of the invention. A pulse diagram 701 illustrates a pulse intensity 703 versus a time 704 for a pulsed source RF power signal Ws 706 and a pulsed bias RF power signal Wb 705. The pulsed source RF power signal Ws 706 includes a plurality of pulses and the pulsed bias RF power signal Wb 705 includes a plurality of pulses, as shown in FIG. 7. In one embodiment, the pulses of the pulsed source RF power signal Ws 706 represent pulses 605. In one embodiment, the pulses of the pulsed bias RF power signal Wb 705 represent pulses 605.

As shown in diagram 701, the duty cycle of the pulsed source RF power signal 706 is about 35%, and the duty cycle of the pulsed bias RF power signal 705 is about 75%. The pulsed bias RF power signal 705 is delayed in time by about 30% of the duty cycle of the pulsed source RF power signal 706, as shown in diagram 701. The pulsed bias RF power signal 705 is shifted in phase relative to the pulsed source RF power signal 706, as shown in diagram 701.

A pulse diagram 702 illustrates a pulse intensity 713 versus a time 714 for a pulsed source RF power signal Ws 708 and a pulsed bias RF power signal Wb 707. The pulsed source RF power signal Ws 708 includes a plurality of pulses and the pulsed bias RF power signal Wb 707 includes a plurality of pulses, as shown in FIG. 7. In one embodiment, the pulses of the pulsed source RF power signal Ws 708 represent pulses 605. In one embodiment, the pulses of the pulsed bias RF power signal Wb 707 represent pulses 605.

As shown in diagram 702, the duty cycle of the pulsed source RF power signal 708 is about 55%, and the duty cycle of the pulsed bias RF power signal 707 is about 55%. The pulsed bias RF power signal 707 is delayed in time relative to the pulsed source RF power signal 708 by about 50% of the duty cycle, as shown in diagram 701. The pulsed bias RF power signal 705 is shifted in phase relative to the pulsed source RF power signal 706, as shown in diagram 702.

A pulse diagram 703 illustrates a pulse intensity 723 versus a time 724 for a pulsed source RF power signal Ws 711 and a pulsed bias RF power signal Wb 709. The pulsed source RF power signal Ws 711 includes a plurality of pulses and the pulsed bias RF power signal Wb 709 includes a plurality of pulses, as shown in FIG. 7. In one embodiment, the pulses of the pulsed source RF power signal Ws 711 represent pulses 605. In one embodiment, the pulses of the pulsed bias RF power signal Wb 709 represent pulses 605.

As shown in diagram 703, the duty cycle of the pulsed source RF power signal is about 75%, and the duty cycle of the pulsed bias RF power signal 709 is about 35%. The pulsed bias RF power signal 709 is delayed in time relative to the pulsed source RF power signal 711 by about 70% of the duty cycle, as shown in diagram 703. The pulsed bias RF power signal 709 is shifted in phase relative to the pulsed source RF power signal 711, as shown in diagram 703.

As shown in diagrams 701, 702 and 703, each pulse of the pulsed source RF power signal Ws is followed by the pulse of the pulsed bias RF power signal Wb. That is, each pulse of the pulsed bias RF power signal Wb is shifted in time, phase, or both in time and phase relative to the pulse of the source RF power signal Ws.

Returning back to FIG. 2, coating layer 201 is deposited on patterned feature 104 on portion 111 of substrate 101 and portion 112 of the substrate 101 is etched. Etching of the portion 112 and depositing of the coating layer 201 are performed in a single pulsed plasma process using at least one of a pulsed source RF power signal and a pulsed bias RF power signal. In one embodiment, the pulsed source RF power signal represents one of the pulsed source RF power signals described above. In one embodiment, the pulsed bias RF power signal represents one of the pulsed bias RF power signals described above. In one embodiment, the timing between the pulsed source power signal and the pulsed bias power signal is controlled to perform the single pulsed plasma process, as described above. In one embodiment, the pulsed bias RF power signal is shifted in phase relative to the pulsed source RF power signal to perform the single pulsed plasma process, as described above.

In one embodiment, a duty cycle of each of the pulsed bias RF power signal and the pulsed source RF power signal is controlled to perform the single pulsed plasma process, as described above. In one embodiment, the duty cycle of the pulsed bias RF power signal is greater than the duty cycle of the pulsed source RF power signal, as described above with respect to diagram 701. In one embodiment, the duty cycle of the pulsed bias RF power signal is substantially similar to the duty cycle of the pulsed source RF power signal, as described above with respect to diagram 702. In one embodiment, the duty cycle of the pulsed bias RF power signal is smaller than the duty cycle of the pulsed source RF power signal, as described above with respect to diagram 703. In one embodiment, the pulsed bias RF power signal is delayed in time relative to the pulsed source RF power signal, as described above.

In one embodiment, at least two processing parameters including e.g., a pressure in the processing chamber, a plasma source power, a bias power, a gas flow, a gas chemistry and a temperature to deposit the coating layer 201 and to etch the portion 112 of the substrate 101 in the single pulsed plasma process are substantially the same. In more specific embodiment, the processing parameters including a pressure in the processing chamber, a plasma source power, a bias power, a gas flow, a gas chemistry and a temperature to deposit the coating layer 201 and to etch the portion 112 of the substrate 101 in the single pulsed plasma process are substantially the same. As the processing parameters to perform the depositing and etching are substantially the same, the single pulsed plasma process does not require changing of the processing parameters each time the system performs the deposition or etch operations that advantageously saves manufacturing time and cost comparing to traditional techniques.

In one embodiment, the time to perform the single plasma process involving the deposition of the coating layer 201 and etching of the portion 112 is in an approximate range from about 5 seconds (sec) to about 100 sec, and in more specific embodiment, is from about 5 sec to about 30 sec. In one embodiment, the pressure in the processing chamber to perform the single plasma process involving the deposition of the coating layer 201 and etching of the portion 112 is in an approximate range from about 2 milliTorr to about 10 milliTorr. In one embodiment, the source RF power Ws to perform the single plasma process involving the deposition of the coating layer 201 and etching of the portion 112 is in an approximate range from about 100 W to about 3000 W at a frequency from about 13.56 MHz to about 162 MHz, and more specifically, the Ws is less than 1000 W at a frequency of about 13.56 MHz. In one embodiment, the bias RF power Wb to perform the single plasma process involving the deposition of the coating layer 201 and etching of the portion 112 is less than about 1000 W at a frequency from about 2 MHz to about 60 MHz, and more specifically, Wb is less than about 500 W at a frequency of about 13.56 MHz. In one embodiment, a gas chemistry to perform the single plasma process involving the deposition of the coating layer 201 and etching of the portion 112 includes argon (Ar), oxygen (O2), silicon tetrachloride (SiCl4) and hydrogen bromide (HBr). In one embodiment, a gas chemistry to perform the single plasma process involving the deposition of the coating layer 201 and etching of the portion 112 includes a fluorocarbon (CF4), Ar and methane (CH4). In one embodiment, a temperature to perform the single plasma process involving the deposition of the coating layer 201 and etching of the portion 112 is in an approximate range from about 5 degrees C. to about 60 degrees C. In one embodiment, the gas flow supplied to the plasma chamber to perform the single plasma process involving the deposition of the coating layer 201 and etching of the portion 112 is from about 100 standard cubic centimeters per minute ("sccm") to about 5000 sccm.

In more specific embodiment, a process gas to deposit coating layer 201 of the silicon oxide byproduct while etching portion 112 of the substrate 101 including the layer 105 of BARC and a portion of the layer 106 of the dielectric using a pulsed source RF power signal and a pulsed bias RF power signal shifted relative to each other in phase includes a HBr gas, an O2 gas, an Ar gas and a SiCl4 gas. In one embodiment, the HBr gas flow supplied to the plasma chamber is from about 50 sccm to about 500 sccm, the oxygen gas flow is from about 5 sccm to about 50 sccm, the Ar gas flow is from about 0 to about 1000 sssm and the flow of SiCl4 gas is from about 5 sccm to about 40 sccm.

In another embodiment, a process gas to deposit coating layer 201 while etching portion 112 of the substrate 101 using a pulsed source RF power signal and a pulsed bias RF power signal shifted relative to each other in phase includes a CF4 gas, an Ar gas and a CH4 gas. In one embodiment, the CF4 gas flow supplied to the plasma chamber is from about 10 sccm to about 100 sccm, the Ar gas flow is from about 0 to about 1000 sssm and the CH4 flow is from about 5 sccm to about 30 sccm.

In one embodiment, the coating layer 201 is deposited to the thickness from about 1 nm to about 20 nm. In one embodiment, the thickness of the portion 205 of the layer 106 is in an approximate range from about 2 percent (%) to about 50% of the original thickness of the layer 106. In more specific embodiment, the thickness of the portion 205 of the layer 106 is in an approximate range from about 10% to about 20% of the original thickness of the layer 106.

In one embodiment, the duty cycle of the pulsed source RF power signal is similar to the duty cycle of the pulsed bias RF power signal to perform deposition and etching operations for the workpiece shown in FIG. 2. In one embodiment, the duty cycle of the pulsed source RF power signal is in an approximate range from about 40% to about 60% and the duty cycle of the pulsed bias RF power signal is in an approximate range from about 40% to about 60% to perform the deposition and etching operations for the workpiece shown in FIG. 2. In one embodiment, the pulsed bias RF power signal is shifted in phase by from about 40% to about 60% of the duty cycle to the pulsed source RF power signal to perform the deposition and etching operations for the workpiece shown in FIG. 2.

Figure 3:
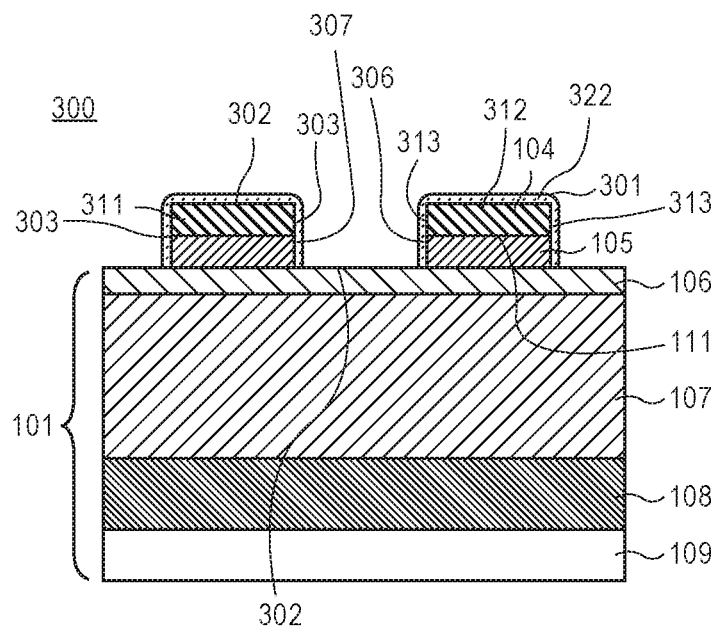
FIG. 3 is a view similar to FIG. 1 after a coating layer is deposited on the features of the patterned photoresist layer according to one embodiment of the invention.

FIG. 3 is a view 300 similar to FIG. 1 after a coating layer 301 is deposited on the features 103 and 104 of the patterned photoresist layer 102 according to one embodiment of the invention. As shown in FIGS. 1 and 3, coating layer 301 is deposited on patterned photoresist layer 102. Portion 112 between the features 103 and 104 is etched, so that coating layer 301 is not deposited on portion 112. The coating layer 301 is deposited and portion 112 is etched to reinforce the EUV photoresist pattern. In one embodiment, depositing of the coating layer 301 and etching the portion 112 is performed in a single pulsed plasma process using at least one of a pulsed source power signal and a pulsed bias power signal, as described above.

In one embodiment, the coating layer 301 is deposited to protect the patterned EUV photoresist layer (mask) during etching of the underlying substrate layers. In one embodiment, the coating layer 301 represents the coating layer 201.

As shown in FIG. 3, the coating layer 301 is not deposited on the portions of the substrate 101 that are not covered by the photoresist features, such as portion 112. The portions of the substrate 101 that are not covered by the photoresist features 103 and 104 are etched to form a feature 311 and a feature 312, as shown in FIG. 3.

As shown in FIG. 3, the portion 112 of the substrate 101 including a portion of the layer 105 is etched to form an opening that exposes a top portion 302 of the layer 106. As shown in FIG. 3, feature 311 is a stack including feature 103 on a portion 306 of the layer 105. Feature 312 is a stack including feature 104 on a portion 307 of the layer 105. Feature 311 has a top portion 302 and opposing sidewalls 303. Feature 312 has a top portion 322 and opposing sidewalls 313. The coating layer 301 is deposited on the top portion and opposing sidewalls of each of the features 311 and 312, as shown in FIG. 3. The portions of the substrate 101 that are covered by the photoresist features 103 and 104, such as portion 111 remain substantially intact by the etching.

FIG. 3 is different from FIG. 2 in that the thickness of the coating layer 301 on the top portions of the features 311 and 312 is smaller than the thickness of the coating layer 201 on the top portions of the features 211 and 212. As shown in FIG. 3, layer 106 remains substantially intact by etching. In one embodiment, the single pulsed plasma process to perform the deposition and etching operations for the workpiece shown in FIG. 3 is more etch dominant than the single pulsed plasma process to perform the deposition and etching operations for the workpiece shown in FIG. 2. In one embodiment, the single pulsed plasma process to perform the deposition and etching operations for the workpiece shown in FIG. 3 is more etch dominant than the single pulsed plasma process to perform the deposition and etching operations for the workpiece shown in FIG. 2.

In one embodiment, the duty cycle of the pulsed source RF power signal is smaller than the duty cycle of the pulsed bias RF power signal to perform the deposition and etching operations for the workpiece shown in FIG. 3. In one embodiment, the duty cycle of the pulsed source RF power signal is in an approximate range from about 10% to about 40% and the duty cycle of the pulsed bias RF power signal is in an approximate range from about 60% to about 90% to perform the deposition and etching operations for the workpiece shown in FIG. 3. In one embodiment, the time delay of the pulsed bias RF power signal relative to the pulsed source RF power signal to perform the deposition and etching operations for the workpiece shown in FIG. 3 is smaller than the time delay of the pulsed bias RF power signal relative to the pulsed source RF power signal to perform the deposition and etching operations for the workpiece shown in FIG. 2. In one embodiment, the pulsed bias RF power signal is shifted in phase by from about 30% to about 60% of the duty cycle of the pulsed source RF power signal to perform the deposition and etching operations for the workpiece shown in FIG. 3.

Figure 4:
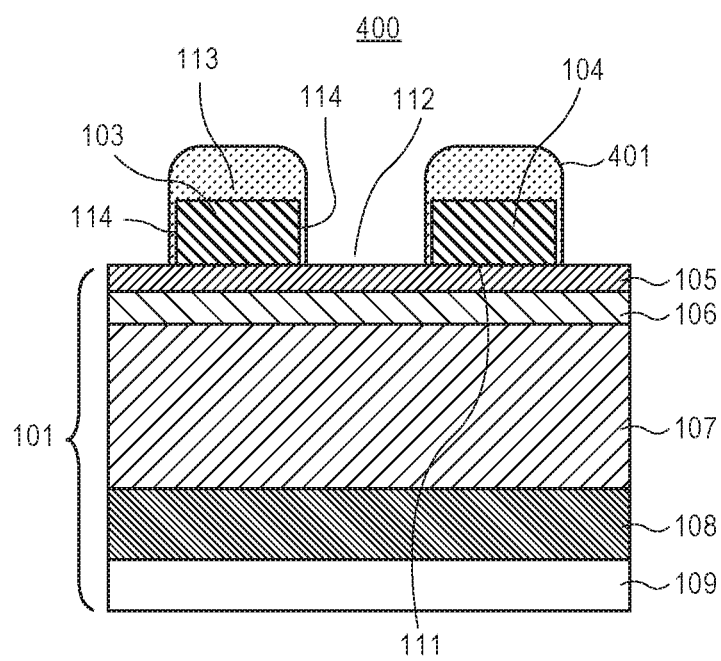
FIG. 4 is a view similar to FIG. 1 after a coating layer is deposited on the features of the patterned photoresist layer according to one embodiment of the invention.

FIG. 4 is a view 400 similar to FIG. 1 after a coating layer 401 is deposited on the features 103 and 104 of the patterned photoresist layer 102 according to one embodiment of the invention. As shown in FIGS. 1 and 4, coating layer 401 is deposited on the features 103 and 104 of the patterned photoresist layer 102. Coating layer 401 is etched away from portion 112 between the features 103 and 104, so that portion 112 is exposed. The deposition and etching of the coating layer 401 to expose the portion 112 is performed to reinforce the EUV photoresist pattern, as described above. In one embodiment, depositing and etching of the coating layer 401 is performed in a single pulsed plasma process using at least one of a pulsed source power signal and a pulsed bias power signal, as described above. In one embodiment, the coating layer 401 is deposited and etched to protect the patterned EUV photoresist layer (mask) during etching of the underlying substrate layers. In one embodiment, the coating layer 401 represents the coating layer 201.

As shown in FIG. 4, the coating layer 401 is not deposited on the portions of the substrate 101 that are not covered by the photoresist features, such as portion 112. As shown in FIG. 4, coating layer 401 is deposited on top portion 113 and sidewalls 114 of each of the features 103 and 104, as shown in FIG. 4. The portions of the substrate 101 that are covered by the photoresist features 103 and 104, such as portion 111 remain substantially intact by the etching.

FIG. 4 is different from FIGS. 2 and 3 in that the thickness of the coating layer 401 on the top portions of the features 103 and 104 is greater than that of the coating layer 201 or coating layer 301. As shown in FIG. 4, layer 105 remains substantially intact by etching. In one embodiment, the single pulsed plasma process to perform the deposition and etching operations for the workpiece shown in FIG. 4 is more deposition dominant than the single pulsed plasma process to perform the deposition and etching operations for the workpiece shown in FIG. 2 or FIG. 3. In one embodiment, the etching rate of the portion 112 of the substrate to manufacture the workpiece shown in FIG. 4 is substantially less than that of the workpiece shown in FIGS. 2 and 3.

In one embodiment, the duty cycle of the pulsed source RF power signal is greater than the duty cycle of the pulsed bias RF power signal to perform the deposition and etching operations for the workpiece shown in FIG. 4. In one embodiment, the duty cycle of the pulsed source RF power signal is in an approximate range from about 60% to about 90% and the duty cycle of the pulsed bias RF power signal is in an approximate range from about 10% to about 40%. In one embodiment, the time delay of the pulsed bias RF power signal relative to the pulsed source RF power signal to perform the deposition and etching operations for the workpiece shown in FIG. 4 is greater than the time delay of the pulsed bias RF power signal relative to the pulsed source RF power signal to perform the deposition and etching operations for the workpiece shown in FIG. 2 or in FIG. 3. In one embodiment, the pulsed bias RF power signal is shifted in phase by from about 60% to about 90% of the duty cycle of the pulsed source RF power signal to perform the deposition and etching operations for the workpiece shown in FIG. 4.

Figure 8:
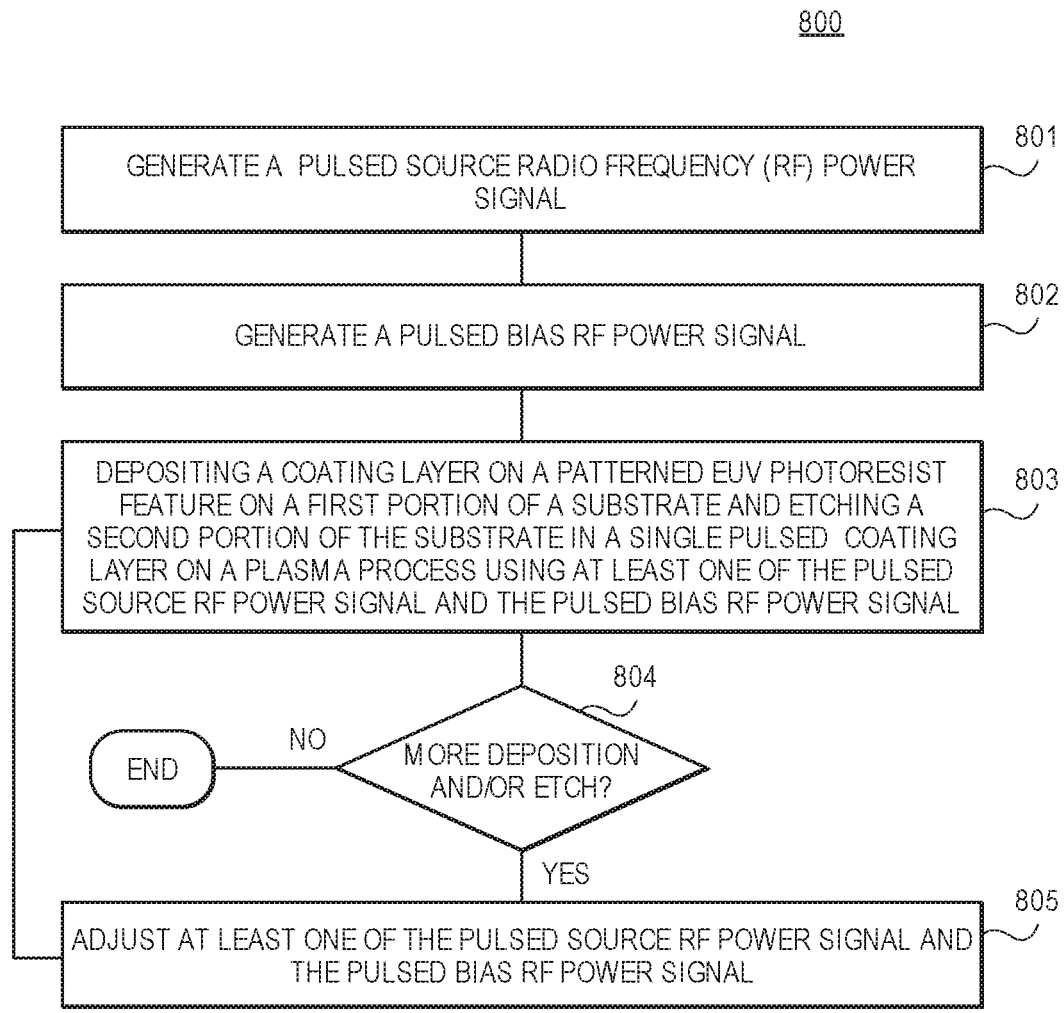
FIG. 8 is a flowchart of a method to provide a EUV photoresist patterning according to one embodiment of the invention.

FIG. 8 is a flowchart 800 of a method to provide a EUV photoresist patterning according to one embodiment of the invention. At operation 801, a pulsed source RF power signal is generated, as described above. At operation 802, a pulsed bias RF power signal is generated that is shifted in phase relative to the pulsed source RF power signal, as described above. In one embodiment, the pulse switching frequency of the at least one of the pulsed source RF power signal and the pulsed bias RF power signal is in an approximate range from about 10 Hz to about 10 kHz, and in more specific embodiment, the pulse switching frequency is in an approximate range from about 0.5 kHz to about 10 kHz.

In alternative embodiments, operation 802 is performed after operation 801, before operation 801, or at the same time as the operation 801. At operation 803, a coating layer is deposited on a patterned EUV photoresist feature on a first portion of the substrate while the coating layer is etched on a second portion of the substrate in a single pulsed plasma process using at least one of the pulsed source RF power signal and the pulsed bias RF power signal, as described above. In one embodiment, the substrate comprises an anti-reflective coating, a hard mask, a polymer layer, a conductive layer, an insulating layer, a semiconductor layer, or any combination thereof, as described above. In one embodiment, the coating layer comprises silicon (Si), bromine (Br), oxide (O), carbon (C), or any combination thereof, as described above. In one embodiment, at least two of processing parameters comprising a pressure, a plasma source power, a bias power, a gas flow, a gas chemistry and a temperature of the single pulsed plasma process to perform the deposition and etching are the same, as described above. At operation 804 it is determined if more deposition, etching, or deposition and etching is needed. If more deposition, etching, or deposition and etching, at operation 805 at least one of the pulsed source RF power signal and the pulsed bias RF power signal is adjusted, as described above. In one embodiment, adjusting at least one of the pulsed source RF power signal and the pulsed bias RF power signal is used to balance deposition versus etching at the same processing parameters, such as a pressure, a plasma source power, a bias power, a gas flow, a gas chemistry and a temperature. In one embodiment, adjusting at least one of the pulsed source RF power signal and the pulsed bias RF power signal involves adjusting timing between the pulsed source RF power signal and the pulsed bias RF power signal, as described above. In one embodiment, adjusting at least one of the pulsed source RF power signal and the pulsed bias RF power signal involves adjusting a duty cycle of at least one of the pulsed source RF power signal and the pulsed bias RF power signal. In one embodiment, adjusting at least one of the pulsed source RF power signal and the pulsed bias RF power signal involves adjusting a phase of at least one of the pulsed source RF power signal and the pulsed bias RF power signal. In one embodiment, the single plasma process having the duty cycle of the pulsed source RF power signal smaller than the duty cycle of the pulsed bias RF power signal involves more etching than deposition, or more deposition than etching, depending on the processing parameters, e.g., a pressure, a plasma source power, a bias power, a gas flow, a gas chemistry and a temperature, or any combination thereof. In another embodiment, the single plasma process having the duty cycle of the pulsed source RF power signal greater than the duty cycle of the pulsed bias RF power signal involves more deposition than etching, or more etching than deposition, depending on the processing parameters, e.g., a pressure, a plasma source power, a bias power, a gas flow, a gas chemistry and a temperature, or any combination thereof.

Figure 9:
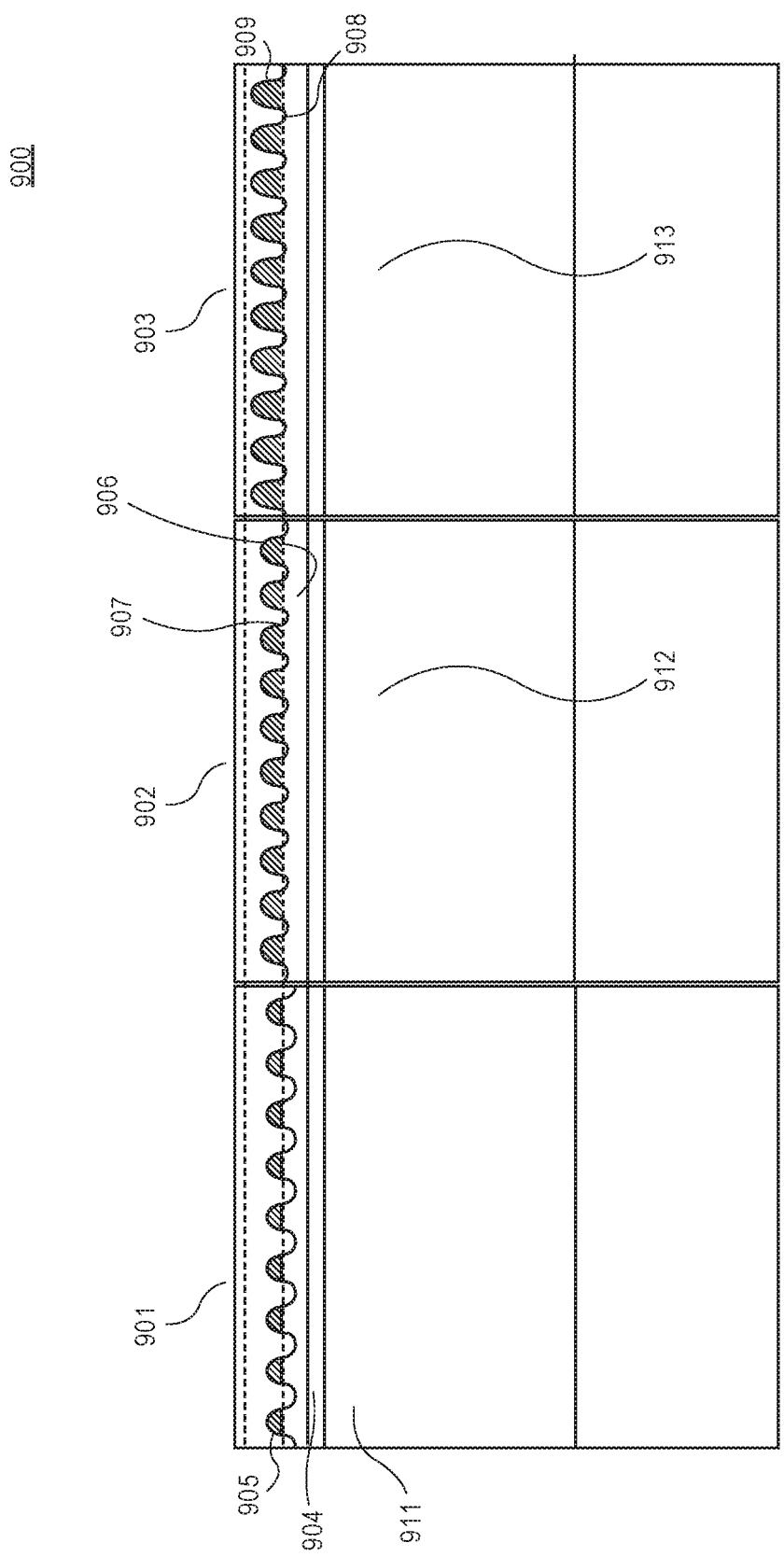
FIG. 9 is a view showing image diagrams of workpieces to provide reinforced EUV photoresist pattern according to one embodiment of the invention.

FIG. 9 is a view 900 showing image diagrams of workpieces to provide reinforced EUV photoresist pattern according to one embodiment of the invention. Diagram 901 shows a workpiece having a reinforced patterned EUV photoresist 905 on a polymer layer 904 on a substrate 911. The patterned photoresist 905 has been reinforced by depositing and etching a coating layer in a single plasma process, as described above. The single plasma process to provide workpiece on diagram 901 has the duty cycle of the pulsed source RF power signal (DCs) of about 35%, the duty cycle of the pulsed bias RF power signal (DCb) of about 75%. The pulsed bias RF power signal is delayed in time by about 30% of the duty cycle of the pulsed source RF power signal. The thickness of the reinforced patterned EUV photoresist layer 905 is about 14.8 nm. The etch rate of the patterned EUV photoresist layer 905 is about 152 angstroms (Å) per min. The etch rate of the underlying polymer layer 904 is about 423 Å per min. Etching selectivity of the polymer layer 904 relative to the EUV photoresist layer 905 is about 2.8.

Diagram 902 shows a workpiece having a reinforced patterned EUV photoresist 907 on a polymer layer 906 on a substrate 912. The patterned photoresist 907 has been reinforced by depositing and etching a coating layer in a single plasma process, as described above. The single plasma process to provide workpiece on diagram 902 has the duty cycle of the pulsed source RF power signal (DCs) of about 55%, the duty cycle of the pulsed bias RF power signal (DCb) of about 55%. The pulsed bias RF power signal is delayed in time by about 50% of the duty cycle of the pulsed source RF power signal. The thickness of the reinforced patterned EUV photoresist layer 907 is about 16.4 nm. The etch rate of the patterned EUV photoresist layer 907 is about 88 Å per min. The etch rate of the underlying polymer layer 906 is about 404 Å per min. Etching selectivity of the polymer layer 906 relative to the EUV photoresist layer 907 is about 4.8.

Diagram 903 shows a workpiece having a reinforced patterned EUV photoresist 909 on a polymer layer 908 on a substrate 913. The patterned photoresist 909 has been reinforced by depositing and etching a coating layer in a single plasma process, as described above. The single plasma process to provide workpiece on diagram 903 has the duty cycle of the pulsed source RF power signal (DCs) of about 75%, the duty cycle of the pulsed bias RF power signal (DCb) of about 35%. The pulsed bias RF power signal is delayed in time by about 70% of the duty cycle of the pulsed source RF power signal. The thickness of the reinforced patterned EUV photoresist layer 909 is about 21.2 nm. The etch rate of the patterned EUV photoresist layer 909 is about 104 Å per min. The etch rate of the underlying polymer layer 908 is about 128 Å per min. Etching selectivity of the polymer layer 908 relative to the EUV photoresist layer 909 is infinity. As shown in diagrams 901, 902 and 903, increasing the DCs relative to the DCb increases the thickness of the patterned EUV photoresist layer and increases the etch selectivity of the underlying polymer layer relative to the EUV photoresist layer.

Figure 10:
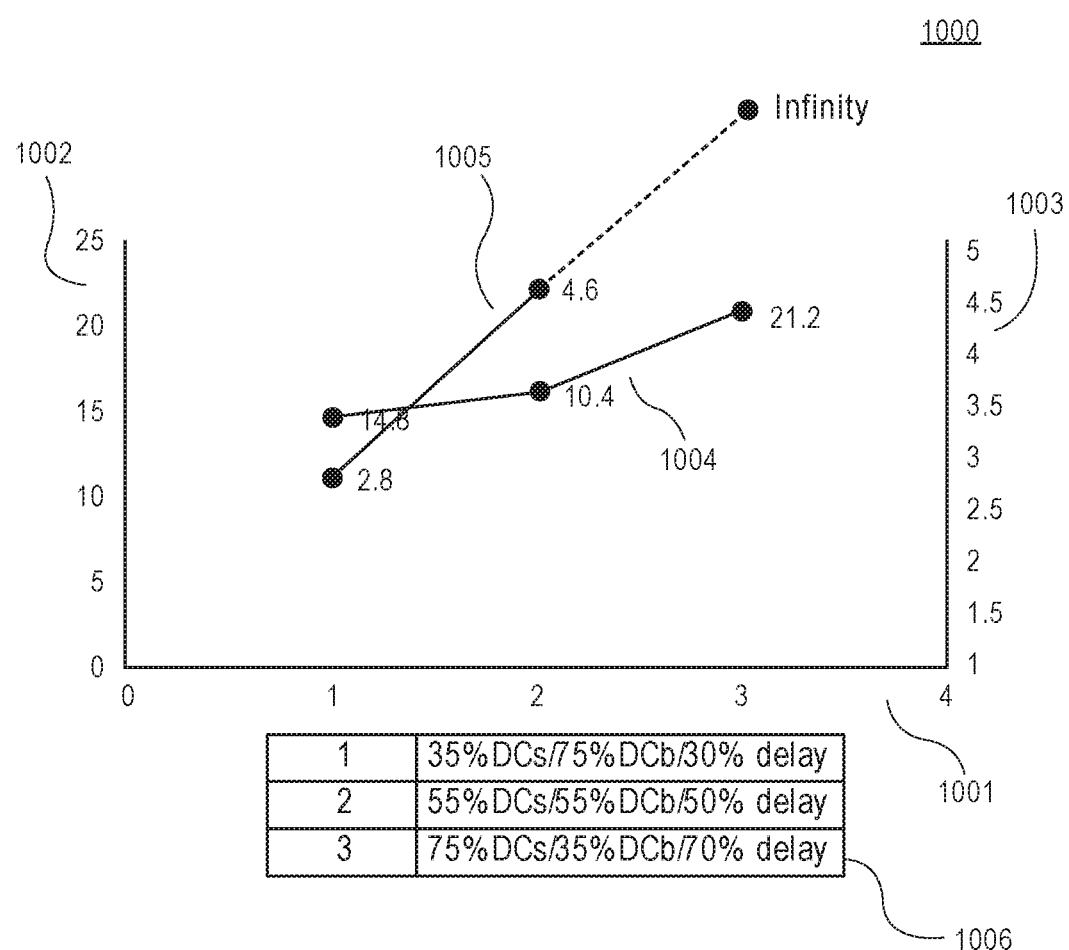
FIG. 10 is a view 1000 showing a graph illustrating the thickness of the reinforced EUV photoresist and the etch selectivity of the underlying layer relative to the reinforced EUV photoresist at various timing conditions according to one embodiment of the invention.

FIG. 10 is a view 1000 showing a graph including a curve 1004 illustrating the thickness of the reinforced EUV photoresist and a curve 1005 illustrating the etch selectivity of the underlying polymer layer relative to the reinforced EUV photoresist at various timing conditions according to one embodiment of the invention. An axis 1001 represents the various timing conditions between the pulsed source RF power signal and pulsed bias RF power signal. An axis 1002 represents the photoresist thickness. An axis 1003 represents the etch selectivity. The timing conditions 1, 2 and 3 are shown in a table 1006. As shown in FIGS. 9 and 10, the timing condition 1 corresponds to that of the diagram 901, the timing condition 2 corresponds to that of the diagram 902 and the timing condition 3 corresponds to that of the diagram 903.

Figure 11:
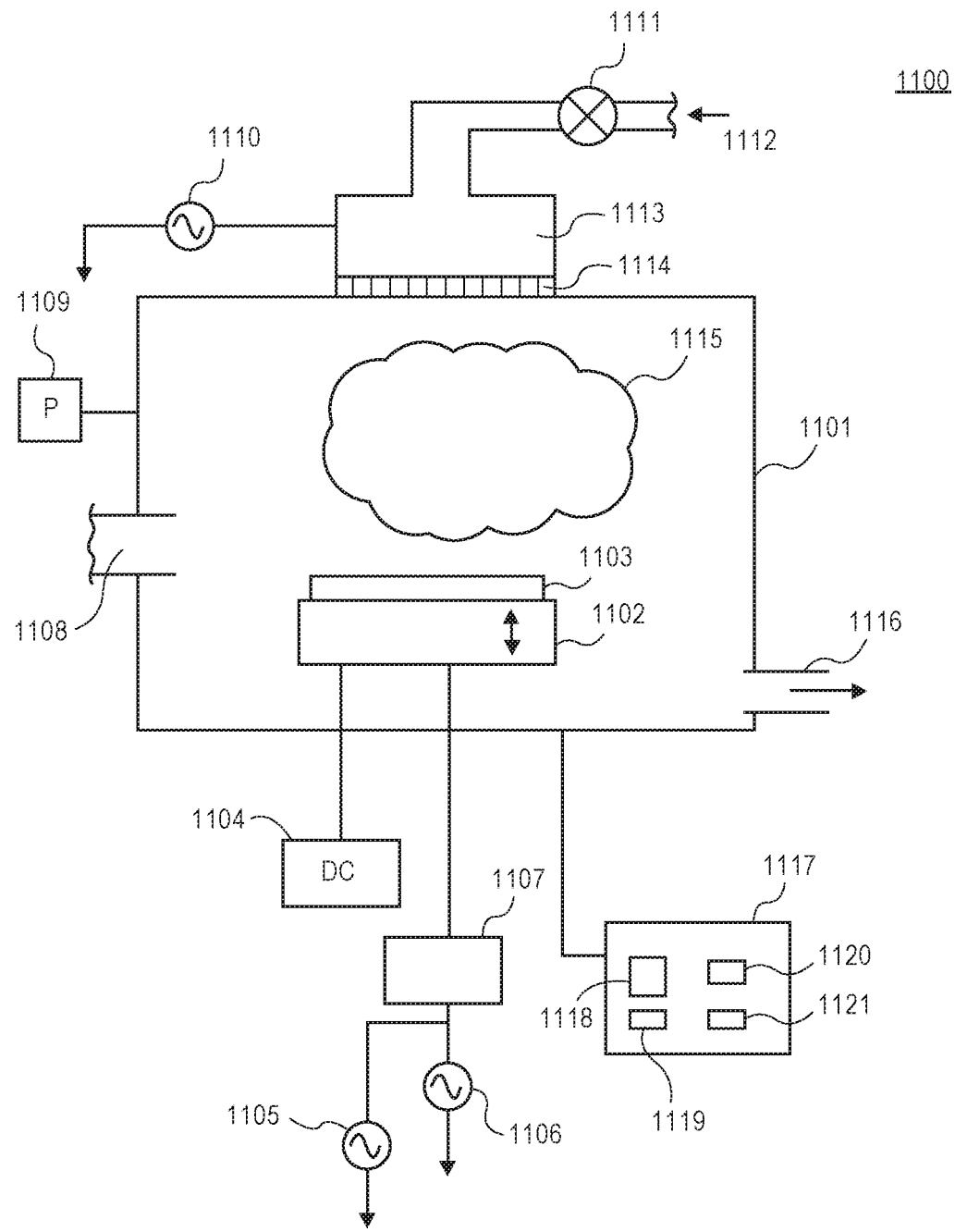
FIG. 11 shows a block diagram of a plasma system to provide a EUV photoresist patterning according to one embodiment of the invention.

FIG. 11 shows a block diagram of a plasma system 1100 to provide a EUV photoresist patterning according to one embodiment of the invention. As shown in FIG. 11, system 1100 has a processing chamber 1101. A movable pedestal 1102 to hold a workpiece 1103 is placed in processing chamber 1101. Pedestal 1102 comprises an electrostatic chuck ("ESC"), a DC electrode embedded into the ESC, and a cooling/heating base. In an embodiment, pedestal 1102 acts as a moving cathode. In an embodiment, the ESC comprises an $Al_2O_3$ material, $Y_2O_3$, or other ceramic materials known to one of ordinary skill of electronic device manufacturing. A DC power supply 1104 is connected to the DC electrode of the pedestal 1102.

As shown in FIG. 11, a workpiece 1103 is loaded through an opening 1108 and placed on the pedestal 1102. The workpiece 1103 represents one of the workpieces described above. System 1100 comprises an inlet to input one or more process gases 1112 through a mass flow controller 1111 to a plasma source 1113. A plasma source 1113 comprising a showerhead 1114 is coupled to the processing chamber 1101 to receive one or more gases 1112 to generate plasma particles, as described above. Plasma source 1113 is coupled to a RF source power supply 1110. Plasma source 1113 through showerhead 1114 generates a plasma 1115 in processing chamber 1101 from one or more process gases 1112 using a high frequency electric field. Plasma 1115 comprises plasma particles, such as ions, electrons, radicals, or any combination thereof, as described above. In one embodiment, plasma 1115 is a pulsed plasma generated using at least one of the pulsed source RF power signal and the pulsed bias RF power signal, as described above. In an embodiment, power source supply 1110 supplies power from about 100 W to about 3000 W at a frequency from about 13.56 MHz to about 162 MHz to generate plasma 1115. In one embodiment, power source supply 1110 is used to generate a pulsed source RF power signal, as described above.

A plasma bias power supply 1105 is coupled to the pedestal 1102 (e.g., cathode) via a RF match 1107 to energize the plasma. In an embodiment, the plasma bias power supply 1105 provides a bias power that is not greater than 1000 W at a frequency between about 2 MHz to 60 MHz, and in a particular embodiment at about 13.56 MHz. A plasma bias power supply 1106 may also be provided, for example to provide another bias power that is not greater than 1000 W at a frequency from about 2 MHz to about 60 MHz, and in a particular embodiment, at a frequency about 60 MHz. Plasma bias power supply 1106 and bias power supply 1105 are connected to RF match 1107 to provide a dual frequency bias power. In an embodiment, a total bias power applied to the pedestal 1102 is from about 10 W to about 3000 W. In one embodiment, bias RF power supply 1110 is used to generate a pulsed bias RF power signal, as described above.

As shown in FIG. 11, a pressure control system 1109 provides a pressure to processing chamber 1101. As shown in FIG. 11, chamber 1101 has one or more exhaust outlets 1116 to evacuate volatile products produced during processing in the chamber. In an embodiment, the plasma system 1100 is an ICP system. In another embodiment, the plasma system 1100 is a capacitively coupled plasma system (CCP) system. In yet another embodiment, the plasma system 1100 is a remote plasma source (RPS) system.

A control system 1117 is coupled to the chamber 1101. The control system 1117 comprises a processor 1118, a timing and phase controller 1119 coupled to the processor 1118, a memory 1120 coupled to the processor 1118, and input/output devices 1121 coupled to the processor 1118 to perform methods described herein.

The processor 1118 has a configuration to control depositing a coating layer on the patterned feature. The processor 1118 has a configuration to control etching a second portion of the substrate, wherein the etching and the depositing are performed in a single pulsed plasma process using at least one of the pulsed source power signal and the pulsed bias power signal, as described above. The processor 1118 has a configuration to control timing between the pulsed source power signal and the pulsed bias power signal. The processor 1118 has a configuration to control a duty cycle of the at least one of the pulsed source power signal and the pulsed bias power signal. The processor 1118 has a configuration to control a pulse switching frequency of the at least one of the pulsed source RF power signal and the pulsed bias RF power signal, as described above. The processor 1118 has a configuration to control delaying of the pulsed bias RF power signal relative to the pulsed source RF power signal. The processor has a configuration to maintain the processing parameters including a pressure, a plasma source power, a bias power, a gas flow, a gas chemistry and a temperature of the single pulsed plasma process to perform the depositing and the etching to be substantially the same. The control system 1117 is configured to perform methods as described herein and may be either software or hardware or a combination of both.

The plasma system 1100 may be any type of high performance semiconductor processing plasma systems known in the art. In an embodiment, the system 1100 may represent one of the plasma systems manufactured by Applied Materials, Inc. located in Santa Clara, Calif., or any other plasma system.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A method to manufacture an electronic device comprising:
   depositing a coating layer on a patterned feature on a first portion of a substrate; and
   etching a second portion of the substrate, wherein the etching and the depositing are performed in a single pulsed plasma process using both a pulsed source power signal and a pulsed bias power signal, wherein at least two of processing parameters comprising a pressure, a gas chemistry and a temperature of the single pulsed plasma process to perform the depositing and the etching are the same, wherein depositing the coating layer and etching the second portion of the substrate are cycled with one another, and wherein the off portion of the duty cycle of the pulsed source power signal does not overlap with the off portion of the duty cycle of the pulsed bias power signal.

2. The method of claim 1, further comprising
   controlling timing between the pulsed source power signal and the pulsed bias power signal.

3. The method of claim 1, wherein a duty cycle of the pulsed bias power signal is greater than a duty cycle of the pulsed source power signal.

4. The method of claim 1, wherein a duty cycle of the pulsed bias power signal is smaller than a duty cycle of the pulsed source power signal.

5. The method of claim 1, wherein a duty cycle of the pulsed bias power signal is similar to a duty cycle of the pulsed source power signal.

6. The method of claim 1 wherein the pulsed bias power signal is delayed relative to the pulsed source power signal.

7. A method to provide an extreme ultraviolet (EUV) photoresist patterning, the method comprising
   generating a pulsed source radio frequency (RF) power signal;
   generating a pulsed bias RF power signal, wherein the pulsed bias RF power signal is shifted relative to the pulsed source RF power signal;
   depositing a coating layer on a patterned EUV photoresist feature on a first portion of a substrate while etching a second portion of the substrate using at least one of the pulsed source RF power signal and the pulsed bias RF power signal, wherein at least two of processing parameters comprising a pressure, a plasma source power, a bias power, a gas chemistry and a temperature of the single pulsed plasma process to perform the depositing and etching are the same, wherein depositing the coating layer and etching the second portion of the substrate are cycled with one another.

8. The method of claim 7, further comprising
   controlling a duty cycle of the at least one of the pulsed source RF power signal and the pulsed bias RF power signal.

9. The method of claim 7, further comprising
   controlling timing between the pulsed source RF power signal and the pulsed bias RF Power signal.

10. The method of claim 7, wherein a pulse switching frequency of the at least one of the pulsed source RF power signal and the pulsed bias RF power signal is in a range from 0.5 kHz to about 10 kHz.

11. The method of claim 7, wherein the substrate comprises an anti-reflective coating, a hard mask, a polymer layer, a conductive layer, an insulating layer, a semiconductor layer, or any combination thereof.

12. The method of claim 7, wherein the coating layer comprises silicon (Si), bromine (Br), oxide (O), carbon (C), or any combination thereof.

13. A system to manufacture an electronic device, comprising:
   a processing chamber comprising a pedestal to hold a workpiece comprising a patterned feature on a first portion of a substrate;
   a plasma source coupled to the processing chamber to generate a pulsed plasma;
   a source power supply coupled to the plasma source to generate a pulsed source power signal;
   a bias power supply coupled to the pedestal to generate a pulsed bias power signal; and
   a processor coupled to the processing chamber, the processor having a first configuration to control depositing a coating layer on the patterned feature, the processor having a second configuration to control etching of a second portion of the substrate, wherein the etching and the depositing are performed in a single pulsed plasma process using both the pulsed source power signal and the pulsed bias power signal, wherein at least two of processing parameters including a pressure, a gas chemistry and a temperature of the single pulsed plasma process to perform the depositing and the etching are the same, wherein depositing the coating layer and etching the second portion of the substrate are cycled with one another, and wherein the off portion of the duty cycle of the pulsed source power signal does not overlap with the off portion of the duty cycle of the pulsed bias power signal.

14. The system of claim 13, wherein a pulse switching frequency of at least one of the pulsed source RF power signal and the pulsed bias RF power signal is in a range from 10 Hz to about 10 kHz.

15. The system of claim 13, wherein the processor has a third configuration to control timing between the pulsed source power signal and the pulsed bias power signal.

16. The system of claim 13, wherein the processor has a fourth configuration to control a duty cycle of at least one of the pulsed source power signal and the pulsed bias power signal.

17. The system of claim 13, wherein the pulsed bias power signal is delayed relative to the pulsed source power signal.

18. A method to manufacture an electronic device comprising:
   depositing a coating layer on a patterned feature on a first portion of a substrate; and
   etching a second portion of the substrate, wherein the etching and the depositing are performed in a single pulsed plasma process using at least one of a pulsed source power signal and a pulsed bias power signal, wherein at least two of processing parameters comprising a pressure, a gas chemistry and a temperature of the single pulsed plasma process to perform the depositing and the etching are the same, wherein depositing the coating layer and etching the second portion of the substrate are cycled with one another, and wherein a duty cycle of the pulsed bias power signal is greater than a duty cycle of the pulsed source power signal.

* * * * *